US007058855B2

(12) United States Patent
Rohfleisch et al.

(10) Patent No.: US 7,058,855 B2
(45) Date of Patent: Jun. 6, 2006

(54) EMULATION INTERFACE SYSTEM

(75) Inventors: Bernhard Rohfleisch, Munich (DE); Axel Freiwald, Munich (DE)

(73) Assignee: Infineon Technologies AG, Munich (DE)

( * ) Notice: Subject to any disclaimer, the term of this patent is extended or adjusted under 35 U.S.C. 154(b) by 504 days.

(21) Appl. No.: 10/202,372

(22) Filed: Jul. 24, 2002

(65) Prior Publication Data

US 2004/0019827 A1    Jan. 29, 2004

(51) Int. Cl.
*G06F 11/00*    (2006.01)
(52) U.S. Cl. ............................. 714/28; 703/23; 703/28
(58) Field of Classification Search .................. 714/28, 714/29; 703/23, 28
See application file for complete search history.

(56) References Cited

U.S. PATENT DOCUMENTS

| | | | | |
|---|---|---|---|---|
| 5,107,450 | A | * | 4/1992 | Lawrenz ..................... 709/224 |
| 5,878,247 | A | * | 3/1999 | Cho ............................ 703/25 |
| 6,425,101 | B1 | | 7/2002 | Garreau |
| 6,738,929 | B1 | * | 5/2004 | Swoboda et al. ............. 714/28 |
| 6,836,882 | B1 | * | 12/2004 | Swoboda .................... 717/134 |
| 6,918,065 | B1 | * | 7/2005 | Edwards et al. |
| 2002/0046016 | A1 | * | 4/2002 | Debling ....................... 703/28 |
| 2002/0147939 | A1 | * | 10/2002 | Wenzel et al. ................ 714/30 |
| 2002/0194538 | A1 | * | 12/2002 | Barrenscheen et al. ....... 714/28 |

OTHER PUBLICATIONS

Microsoft, Microsoft Computer Dictionary, 2002, Microsoft Press, Fifth Edition, pp. 27, 128, 149, 159, 162, 186, 195, 198, 216, 232, 297, 350, 426, 437, and 456.*
Agrawal, V.D., et al., "A Tutorial on Built-In Self-Test:: Part 1: Principles," IEEE Design and Test of Computers, Mar. 1993, pp. 1-12.
Agrawal, V.D., et al., "A Tutorial on Built-In Self-Test: Part 2: Applications," IEEE Design and Test of Computers, Jun. 1993, pp. 1-11.
Howard, S., "A Backgroud Debugging Mode Driver Package for Modular Microcontrollers," Motorola Semiconductor Application Note, 1996, pp. 1-16.
Murray, B.T., et al., "Testing ICs: Getting to the Core of the Problem," Computer, Nov. 1996, pp. 1-9.
Kaskowitz, M., "System Design in the 21$^{st}$ Century," Mentor Graphics, http://www.mentorg.com/embedded/articles/enews_40901.html, Jun. 25, 2001, pp. 1-2.
"SoC Solutions: Embedded Software: The new element of SOC systems design," Mentor Graphics, http://www.mentorg.com/soc/embedded.html, Jun. 25, 2001, p. 1.

(Continued)

*Primary Examiner*—Scott Baderman
*Assistant Examiner*—Paul Contino
(74) *Attorney, Agent, or Firm*—Slater & Matsil, L.L.P.

(57) ABSTRACT

An integrated circuit with multiple circuit cores each of which have integrated emulated circuits, and an emulation interface module, such that the integrated circuit has an on-chip debugging system. As cores other than a processor core have integrated emulation circuits, debugging of programs and operations of systems-on-a-chip becomes viable.

53 Claims, 3 Drawing Sheets

OTHER PUBLICATIONS

Oakes, C., et al., "One Processor Fits All," Wired News, http://www.wired.com/news/technology/0,1282,16239.00.html, Jun. 25, 2001, pp. 1-2.

"System-on-Chip Markets and Trends: A Comprehensive Report Examining Global Markets and Applications for System-Level Semiconductor Products," Electronic Trend Publications, http://www.electronictrendpubs.com/soc.htm, Jun. 25, 2001, pp. 1-7.

"EDA WATCH: System Chip Verification: Moving From ASIC-Out To 'System-In' Methodologies," Electronic Design, http://www.planetee.com/planetee/servlet/DisplayDocument?ArticleID=1001, Jun. 25, 2001, pp. 1-4.

"TechEncyclopedia: System On a Chip," TechWeb: The Business Technology Network, http://www.techweb.com/encyclopedia/defineterm.yb?term=SoC, Jun. 25, 2001, pp. 1-2.

Clarke, P., et al., "SoCs Mark Dawn Of Golden Era," TechWeb: The Business Technology Network, http://content.techweb.com/wire/story/TWB20001127S0009, Nov. 27, 2000, Munich, Germany, pp. 1-2.

Semiconductor Business News, "System-On-Chip Market To Boom By 2004," TechWeb: The Business Technology Network, http://content.techweb.com/wire/story/TWB20001025S0014, Oct. 25, 2000 pp. 1-2.

Leopold, G., "Net Will Drive System-On-Chip Development," TechWeb: The Business Technology Network, http://content.techweb.com/wire/story/TWB19990916S0003, Sep. 16, 1999, pp. 1-2.

"ASIC Core Libraries," ROHM, http://www.rohm.com/products/shortform/01asic/4core.html, Jul. 23, 2001, pp. 1-2.

"Embedded Software Debugging for MIPS32 Systems-on-Chip," Mentor Graphics, www.mentor.com, pp. 1-8.

"Integrated Debug of Embedded Systems With The TLA 700," Tektronix, 1998, pp. 1-8.

IEEE-ISTO 5001™-1999, The Nexus 5001 Forum™ Standard providing the Gateway to the Embedded Systems of the Future, Ashling Microsystems Ltd., Version 1.1, Jan. 13, 2000, pp. 1-8.

JTAG (IEEE 1149.1/P1149.4, Tutorial-Introductory, 1997 TI Test Symposium, Sep. 10, 1997, pp. 1-46.

"Application Programming Interface (API)," IEEE-ISTO 5001™-1999, The Nexus 5001 Forum™ Standard for a Gloval Embedded Processor Debug Interface, Dec. 15, 1999, pp. 28-50.

Press Release: "Ashling launches initative on multi-core SoC debugging," Ashling Microsystems, Inc., U.S., Mar. 2002.

* cited by examiner

EMULATION INTERFACE SYSTEM

BACKGROUND OF THE INVENTION

The present invention relates to the testing and debugging of integrated circuits, and more particularly, the use of on-chip-debugging circuitry in ASICs such as systems-on-a-chip.

Continuing progress in the field of semiconductor technology, and especially, semiconductor fabrication, allows more and more circuitry to be placed on a single integrated circuit. This enables an increasing number of functions to be placed on a single integrated circuit. Therefore, a set of functions which formerly would be distributed across multiple integrated circuits mounted on a printed circuit board (PCB), may now be aggregated on a single integrated circuit. Such an integrated circuit is often called a "System on a Chip" (SOC). The rapid development and commercialization of such SOCs yields new problems for the SOC programmer, system design engineer, or the system integration engineer. One such problem is the design validation and debugging of programs, either in firmware or in software, which are to run on the SOC.

Often, an SOC includes the functions of an integrated circuit called an "embedded processor." In the past, embedded processors were more likely to be found as separate integrated circuits on PCBs. Embedded processors are microprocessors often used for controlling apparatuses and performing other tasks for which a more expensive general purpose CPU was not appropriate. Continuing progress in the field of semiconductor technology has blurred the lines between embedded processors and general purpose processors. The use of embedded processors has raised similar program testing and debugging issues as those now presented with respect to SOCs. A variety of tools have been developed to efficiently debug programs on embedded processors. One such tool is the logic analyzer, which is a general purpose tool that, when attached to an embedded processor main bus and various other pins, can provide passive data collection regarding the performance of software on an embedded processor. A pin, in this context, is a connection wire off an integrated circuit. Another tool is an in-circuit-emulator, a processor-specific tool which emulates the function of the target processor while allowing access to information about the performance of the program run on the emulated processor. Moreover, the in-circuit-emulator may change the type and kind of information to which it provides access. In addition, the in-circuit-emulator would allow the state of the embedded processor to be changed (for example, register values could be specifically and independently altered). In each case, these various tools generate data regarding the execution of a program on a processor.

Another approach to debugging embedded processors is to integrate or embed emulation circuits in the processor (called "on-chip-emulation"). This approach has become more common as embedded processors have achieved progressively higher processing speeds and register widths, thus increasing the needed output bandwidth. This type of emulation may be referred to as an On-Chip-Debug System, hereinafter "OCDS." An OCDS consists of circuits to monitor the state of an embedded processor, to configure the state of an embedded processor, and to communicate with an external debug tool. The external debug tool is often connected to a host computer running debugging software, and acts as a translator between the OCDS and a host computer such as a PC.

It is noted that the "state" of a microprocessor is its condition given in terms of the contents of its registers, internal flags, local memory, etc. Similarly, the state of a register or other memory is its condition including the value stored within it.

A variety of protocols and standards have been established concerning embedded processors that establish parameters for OCDSs. The Joint Test Action Group standard, referred to as "JTAG", is the IEEE standard for boundary scans (IEEE 1149.1). Among other things, it establishes the parameters for testing a series of input/output registers through a set of dedicated testing pins. JTAG is the standard interface for sending commands and performing data exchange with embedded processors. JTAG is relatively simple but comparatively slow interface, exchanging about 10 MBits/s at 10 MHz of information. It is often used even in the context of other interfaces to set up test conditions, send control commands and the like.

Another interface standard for OCDSs is the Nexus 5001 Standard for a Global Embedded Processor Debug Interface (IEEE-ISTO 5001). This interface standard is capable of a much higher bandwidth, the bandwidth necessary to deal with so-called "trace information" (see below) which can be output at a high rate, e.g. 100–200 MHz. Nexus 5001 has a number of different versions that call for different levels of control and access of the target processor. The simplest case of the Nexus 5110 standard can be implemented using a JTAG interface. The higher bandwidth of the Nexus 5001 standard is often implemented just to read out data from an embedded processor, but the bandwidth may be applied bi-directionally.

Other standards exist for implementing an OCDS in an embedded processor. Some manufactures of embedded processors create and maintain a proprietary standard for their processors. An example of a company doing so is ARM®.

Among the capabilities that an OCDS of an embedded processor should have to debug a program is the ability to collect trace information. Trace information includes program trace information such as time stamps and branch messages. The external debug tool and/or the host computer can use this program trace information to reconstruct the program flow. Another type of trace information that should be collected by the OCDS is data trace information. Data trace information is a list of reads and writes (values and locations) to memory performed by the embedded processor.

The OCDS may also have the capability of monitoring for specified events in the target processor. Such events include breakpoints and watchpoints. Break points or watchpoints are specified conditions for which the OCDS monitors the embedded processor. If a specified condition occurs (e.g., the value of specified register equals a specification) then either the operation of the embedded processor is halted (a breakpoint) or a note that the condition occurred is made (watchpoint). The OCDS should collect such event information. Preferably, the OCDS may also change the type or amount of trace information gathered as a result of a watchpoint. Further capabilities of an OCDS may include the ability to test and, potentially, alter the value in each individual register of the embedded processor, as well as other memory locations within the embedded processor.

In the past, an embedded processor may have been one of many integrated circuits on a PCB. While the debugging techniques discussed above may be applied to the embedded processor (as a separate integrated circuit), the other integrated circuits of the PCB have not heretofore had OCDS capabilities. Rather, other tests were performed on the PCB board to check the functioning of the other integrated circuits and to obtain debugging information from the other integrated circuits. These tests were necessary so the PCB as a whole could undergo testing and debugging. Note that testing usually occurs during the design phase of a project, while debugging occurs during the implementation phase. All of these tests for debugging multiple chips on a PCB face the same problem-extracting information from chips which usually have no dedicated provision for exporting or outputting state information. Often a test used for debugging a PCB connects and monitors the many lines connecting each chip of the PCB. This allows the input and output signals to the chip to be monitored. As the number of chips increases, the number of lines connecting chips to the rest of the PCB increases proportionately. Therefore, the output of information off the PCB needed to monitor and debug the PCB can also increase as needed, making such debug testing of PCBs practical.

As noted before, the variety of functions performed by multiple integrated circuits on a PCB are now being integrated onto an SOC. One of these functions is that of an embedded processor. A function on an SOC can be described as being performed by a functional unit or core of circuitry. Thus, the functions of an embedded processor may be performed by a processor core. This processor core of circuitry on an SOC will often have a fewer number of pins dedicated for its use than when the equivalent function was performed by a processor as a separate integrated circuit. Increasing the number of pins increases the manufacturing expense. Therefore, fewer pins are available for testing purposes, and on-chip debugging systems become even more important. Thus, an SOC using a processor core will dedicate valuable chip area to on-chip debugging systems. Such on-chip debugging systems, designed in accordance with standards such as NEXUS 5001 will use a set number of pins for testing. Implementation of such an on-chip debugging system for a processing core in an SOC will prevent the activity of a program within the processing core from being hidden and allow the programmer to perform design validation, testing and debugging.

However, an SOC having a processor core will include other circuit cores When the functions of such other circuit cores were performed by separate integrated circuits on a PCB, the passive data collection of the PCB tests noted above were adequate for debugging purposes. However, like the processor core, the other circuit cores will usually have proportionately less pins available than when their equivalent function was performed as a separate integrated circuit, due to the increasing expense of such pins in cost and chip area. As such, process activity in these other circuit cores will be "hidden" from (e.g. will be less accessible to) the SOC designer or programmer, as less pins, or lines or other points will be available for monitoring. Rather, information that would have passed between the integrated circuits on a PCB will now remain within the integrated circuit of an SOC and thus be unavailable for detection by a programmer by the previously described methods.

Accordingly, there is a need in the art for a new apparatus and/or method for validating and debugging an SOC efficiently.

SUMMARY OF THE INVENTION

In accordance with one or more aspects of the present invention, an integrated circuit is provided which includes at least one processor core. The integrated circuit also includes at least one processor emulator circuit which is coupled to the at least one processor core and operable to provide information indicative of process activity associated with the at least one processor core. The integrated circuit also includes at least one other core. The integrated circuit also includes an at least one other emulator circuit which is coupled to the at least one other core and operable to provide information indicative of process activity associated with the at least one other core. The integrated circuit also includes an emulation interface circuit coupled to the at least one processor emulator circuit and the at least one other emulator circuit. The emulator circuit is operable to receive the respective information indicative of the process activity associated with the at least one processor core and the at least one other core.

In another aspect of the present invention, the above integrated circuit includes a common reference clock signal. The processor emulator data signals include timing information from the common reference clock signal. The other emulator data signals include timing information from the common clock signal.

In accordance with a further aspect of the present invention, a system for debugging integrated circuits is provided. The system includes a debug tool and a target integrated circuit. The integrated circuit includes at least one processor core. The integrated circuit also includes at least one processor emulator circuit which is coupled to the at least one processor core and operable to provide information indicative of process activity associated with the at least one processor core. The integrated circuit also includes at least one other core. The integrated circuit also includes an at least one other emulator circuit which is coupled to the at least one other core and operable to provide information indicative of process activity associated with the at least one other core. The integrated circuit also includes an emulation interface circuit coupled to the at least one processor emulator circuit, the at least one other emulator circuit, and the debug tool. The emulation interface circuit is operable to receive the respective information indicative of the process activity associated with the at least one processor core and the at least one other core, and output the respective information to the debug tool.

In accordance with a further aspect of the present invention, an enhanced circuit core on an integrated circuit is provided. The enhanced circuit core includes a non-processor core and an emulator circuit. The emulator circuit is coupled to the non-processor core, and is operable to produce non-processor core data signals containing information indicative of process activity associated with the non-processor core.

In accordance with a further aspect of the present invention, a debug tool is provided. The debug tool includes a receiving circuit operable to receive emulation interface circuit data signals including information indicative of process activity in at least one processor core and information indicative of process activity in at least one other core. The debug tool also includes a translation circuit operable to change the emulation interface circuit data signals into host readable data signals. The debug tool further includes a transmitting circuit operable to transmit the host readable data signals.

In accordance with a further aspect of the present invention, an emulation interface circuit on an integrated circuit is provided. The emulation interface circuit includes a first circuit operable to receive information indicative of operative activity associated with the at least one processor core on the integrated circuit. The emulation interface circuit also includes a second circuit operable to receive information indicative of operative activity associated with the at least one other core on the integrated circuit.

In accordance with one further aspect of the present invention, a method of debugging a program operating on an integrated circuit is provided. The method includes detecting information indicative of process activity in a processor core with a processor emulator circuit. The method also includes detecting information indicative of process activity in the other core with the other emulator circuit. The method also includes providing the information indicative of process activity in a processor core to an emulation interface circuit. The method also includes providing the information indicative of process activity in the other core to the emulation interface circuit.

DETAILED DESCRIPTION

Figure 1:
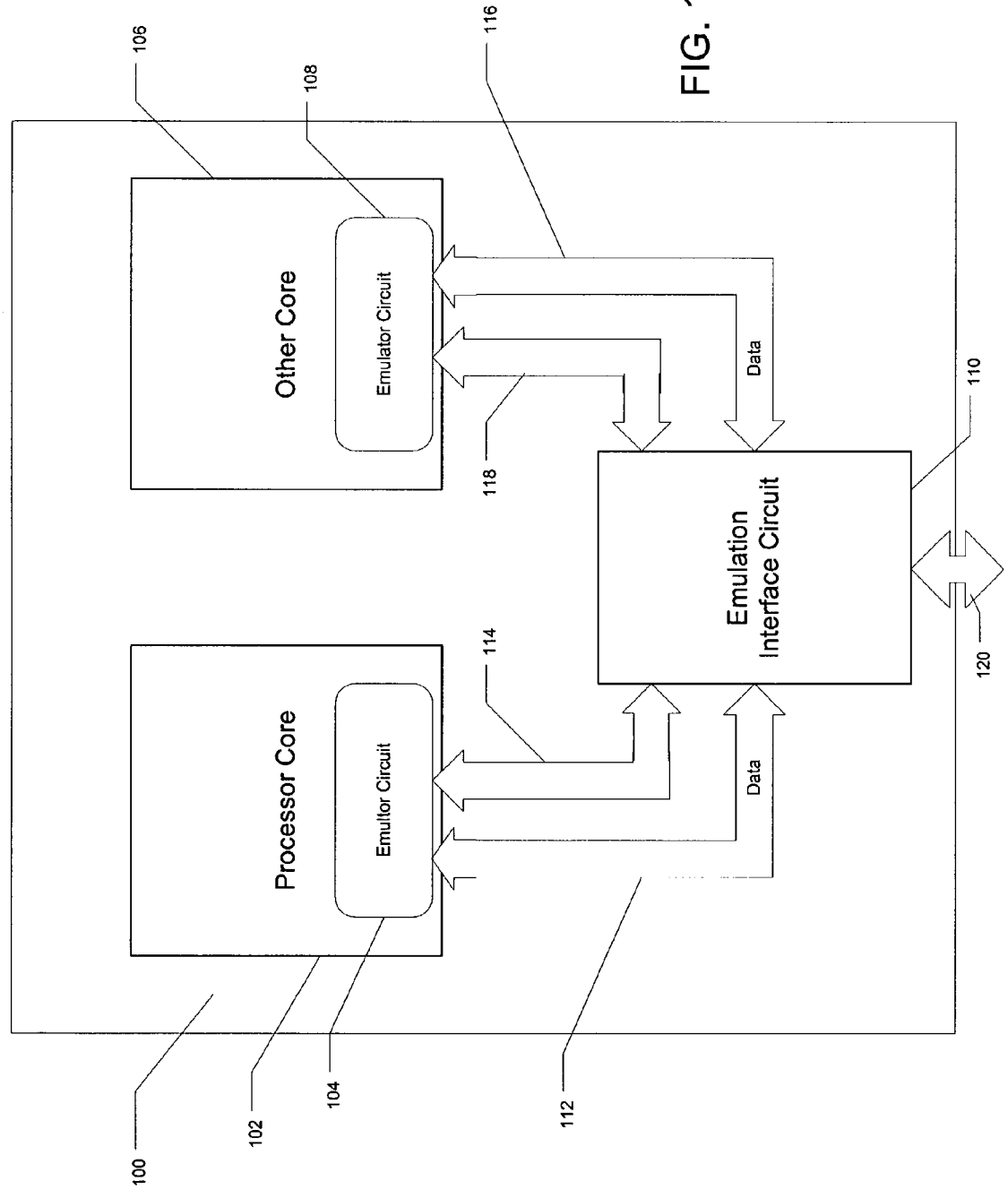
FIG. 1 is a block diagram illustrating an integrated circuit in accordance with one or more aspects of the present invention.

Referring now to the drawings, wherein like numerals indicate like elements, there is shown in FIG. 1 a block diagram of integrated circuit 100. Preferably, the integrated circuit 100 is an SOC, for example, an application specific integrated circuit (ASIC). Integrated circuit 100 preferably includes a plurality of cores of circuitry (e.g., circuit cores 102, 106, and/or others not shown). Some of the types of cores available to an SOC designer are discussed in more detail below. The circuit cores are preferably selected and coupled together using "glue logic" to create the SOC. Such circuit cores as employed by ASICs and other SOCs may also be referred to as functional units, system level macro components, macro functions, function blocks, macro cells, function cells, system level building blocks or any other like terms. Each of these terms refers to a separate group of circuits with a dedicated function or functions.

Preferably, the integrated circuit 100 includes a processor core 102, at least one other core 106, and an emulator interface circuit 110. The processor core 102 preferably includes (or is associated with) an emulator circuit 104, which is operable to provide access to the operation of processor core 102 (e.g., access to process activity that otherwise would not be monitorable). Emulator circuit 104 provides data signals on emulator data channel 112 regarding the state or operation of processor core 102. Alternatively, information about data flow can be passed from emulation interface circuit 110 to emulation circuit 104 over control channel 114.

Preferably, the emulator circuit 104 may provide access to the processor core 102, and thus provide different types and amounts of data over data channel 112 to emulation interface circuit 110. Emulation interface circuit 110 is preferably operable to cause the emulator circuit 104 to change the type of amount of process activity being monitored in processor core 102, and thus the type and amount of data being passed over data channel 112 to emulation interface circuit 110. By way of example, the emulation interface circuit 110 may cause emulator circuit 104 to monitor and pass a great deal more information or less information about the processes within the processor core 102.

The emulator circuit 104 is also preferably operable to alter the state (or condition) and operation of the processor core 102 according to control signals received over emulator control channel 114. Preferably, emulator interface circuit 110 provides the emulation control signals over emulator control channel 114 and receives the data signals indicating the state or condition of the emulator circuit 104.

Although the specific content of the data signals provided by the emulator circuit 104 is in large part dependent on the specific type of processor core 102 employed, in accordance with the invention, it is preferred that the data signals contain information suitable for testing, design validation, debugging, etc. For example, the emulator circuit 104 might provide program trace and data trace information from the processor core 102 to the emulator interface circuit 110. Emulator circuit 104 may also provide data signals containing information regarding one or more registers within the processor core 102, preferably information directed to testing, design validation, debugging, etc. For example, emulator circuit 104 may provide data signals containing the state of one or more registers within the processor core 102. This information provided by the data signals from emulation circuit 104 may be considered to give some or all of the state of the processor core 102.

The emulator circuit 104 is preferably responsive to the control signals received over emulator control channel 114 from the emulation interface circuit 110. Again, the specific content of the control signals is likely to be dependent on the type of processor core 102 employed. However, the control signals received by emulator circuit 104 over emulator control channel 114 may cause changes in both the emulator circuit 104 and processor core 102. In a preferred embodiment, the control signals may cause the emulator circuit 104 to monitor processor core 102 for specified events such as watchpoints or breakpoints, or to change the amount or type of trace information gathered. If emulator circuit 104 is able to receive such control signals, emulation data signals received by the emulation interface circuit 110 over emulator data channel 112 may include information regarding such specified events as breakpoints and watchpoints.

In another embodiment, the control signals may cause emulator circuit 104 to change the state of circuits in processor core 102. In another embodiment, the control signals may cause emulator circuit 104 to change the state of registers within processor core 102. Additionally, the control signals may cause emulator circuit 104 to change the state of the memory locations in the processor core. If emulator circuit 104 is able to receive such control signals, emulation data signals received by the emulation interface circuit 110 over emulator data channel 112 would include information regarding the state of such memory locations.

Other core 106 preferably includes (or is associated with) an emulator circuit 108, which is operable to provide access to the operation of the other core 106. Other core 106 is not a processor core. Emulator circuit 108 preferably provides access to the circuits and functions within the other core 106 to facilitate testing, design validation, debugging, etc. To that end, the emulator circuit 108 preferably provides data signals on emulator data channel 116 to the emulation interface circuit 110. The specific content of the data signals provided by emulator circuit 108 will vary depending on the specific type of other core 106 employed. The range of variation is very large to the large number of possible other cores 106. For example, if other core 106 is primarily analog circuitry, then emulation circuit 108 might provide information regarding when the voltage of a specific point exceeds a programmed level. If the other core 106 is primarily digital logic circuitry, it may be considered a finite state machine and information regarding the state of the other core may be provided by the emulator circuit 108. The information, regardless of the type of other core 106, is preferably for testing, design validation, debugging, etc.

The emulator circuit 108 is preferably responsive to the control signals received over emulator control channel 118 from the emulation interface circuit 110. The specific content of the control signals is likely to be dependent on the type of other core 106 employed. However, the control signals received by emulator circuit 108 over emulator control channel 118 may cause changes in both the emulator circuit 108 and other core 106. In a preferred embodiment, the control signals may cause the emulator circuit 108 to monitor other core 106 for specified events such as watchpoints or breakpoints, or to change the amount and kind of trace information collected. If emulator circuit 108 is able to receive such control signals, emulation data signals received by the emulation interface circuit 110 over emulator data channel 116 may include information regarding such specified events as breakpoints and watchpoints as well as such trace information.

Control signals provided by emulation circuit 110 may also cause emulator circuit 108 to cause a change in operations of other core 106. By way of example, such changes in operation may include altering the states (or values) in registers in other core 106. Emulator circuit 108 may also provide state information or condition information about itself to emulation interface circuit 110.

Processor core 102 and other core 106 are likely to have different commands due to different architectures. If the set of commands are similar enough, or, in other words, the two processors can be modeled as similar enough state machines, then the commands and interpretations controls can reside primarily in the emulation interface circuit 110. This is desirable as it saves chip real estate. However, in the more general scope where the state machine models of the two processors 102 and 106 are very different, the majority of the information and logic needed to command and interpret signals to and from other core 106 will be in emulator circuit 108.

The testing, design verification, debugging, etc. activities are preferably influenced by circuits outside the integrated circuit 100. To that end, the emulator interface circuit 110 preferably includes a port 120 through which input/output (I/O) information passes to/from outside the integrated circuit 100. The I/O information preferably causes emulator interface circuit 110 to send the control signals to both emulator circuit 104 and emulator circuit 108. Similarly, the data signals from both emulator circuit 104 and emulator circuit 108 are preferably provided from the emulation interface circuit 110 through port 120 as part of the I/O information. As noted above, the amount of processing performed by emulation interface circuit 110 depends on emulator circuits 104 and 108. However, the emulation interface circuit 110 will at least compress information, send and receive messages and select what data to transmit.

Figure 1A:
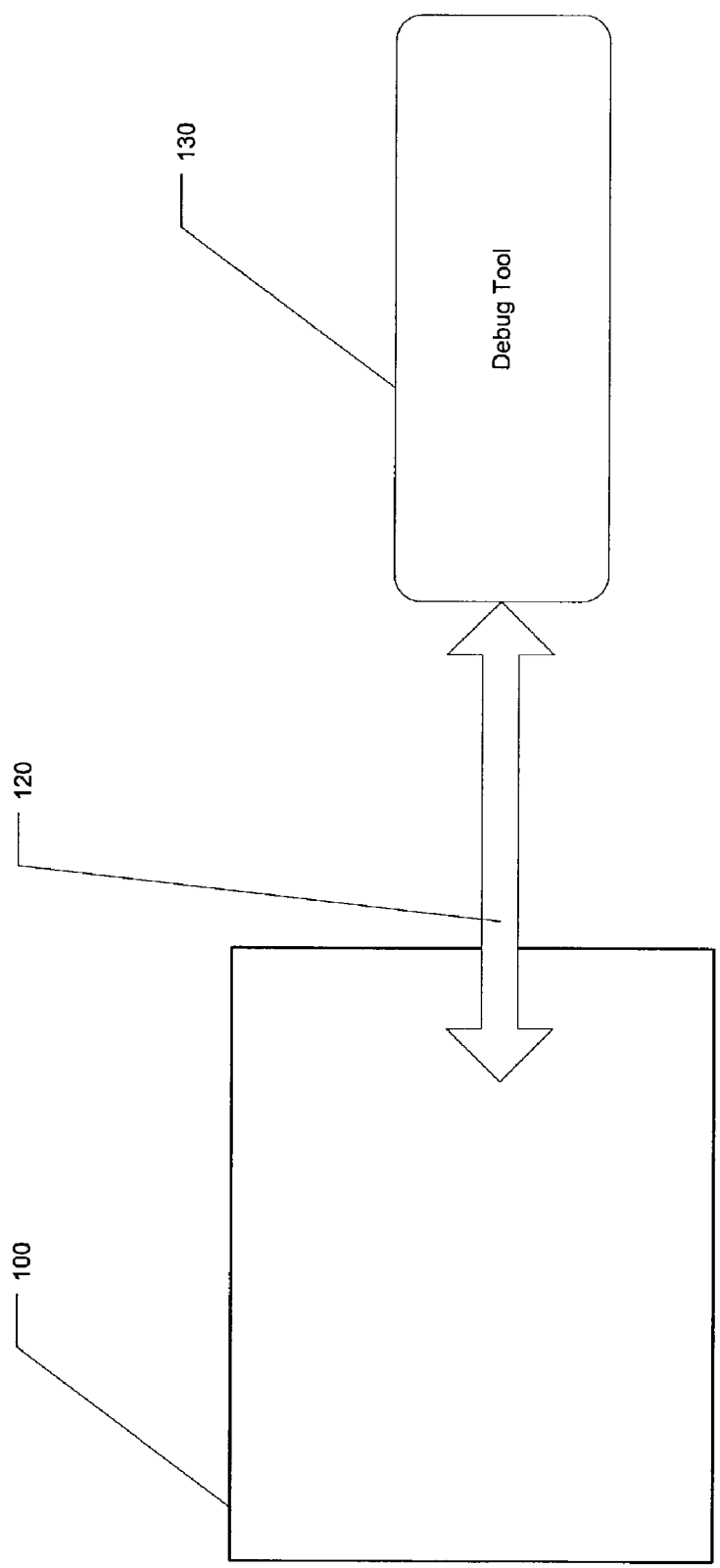
FIG. 1A is a block diagram of a system in accordance with one or more aspects of the present invention.

FIG. 1A shows the on-chip debugging system of integrated circuit 100 operatively coupled to circuits outside integrated circuit 100. Integrated circuit 100 is shown, as is port 120. Port 120 is attached to debug tool 130. Debug tool 130 includes circuitry necessary for interfacing with the emulation interface circuit 110. By way of example, debug tool 130 may contain the circuitry necessary for communication in accordance with the protocols set by the JTAG and NEXUS 5001 standards. The debug tool may include more functions to assist a programmer or system architect. Such functions may include the time ordering and display of program trace and data trace information, as well as event information, from the emulation interface circuit 110. Alternatively, some of these functions may be assumed by a personal computer or other general purpose computing apparatus attached to debug tool 130.

The term "time ordering" as used within this specification shall refer to the ordering of pieces of information according to a time stamp associated with each piece. Such time ordering allows information to flow out of the SOC 100 in any time order, and if all the pieces of information been synchronized by time stamping at the appropriate moment with a reference clock, to be reordered outside the SOC. Thus, the use of a reference clock to time stamp any piece of information for debugging before outputting from the SOC allows the designer to not have to dedicate chip real estate to circuitry for keeping the pieces of information ordered within the SOC, and does not have to account for the increased bandwidth that would be required to move and output the internally time ordered information.

Advantageously, the emulator circuits 104, 108 and the emulator interface circuit 110 permit an SOC designer or programmer to test, evaluate, and/or debug the processor core 102 and/or the other core 106 using the emulation interface circuit 110. Thus, among other things, additional testing capability of other core 106 is obtained without requiring additional interface circuitry. Indeed, as the emulation interface circuit 110 would be employed for the emulator circuit 104 in any case, integrated circuit real estate and fabrication expense are reduced. Further, the use of a single interface circuit 110 for both processor core 102 and other core 106 allows a single port 120 to be used for both processor core 102 and other core 106. Thus, advantageously, the number of pins needed to be dedicated to testing an SOC need not be increased with the number of other cores available.

It is noted that the number of cores available to a designer (for example, that may be listed in ASIC library) for designing an SOC are considerable. Examples include, processor cores, such as the well known ARM (Advanced Risk Machine) processor cores, memory cores, such as RAM memory cores (including the many different varieties of RAM), ROM memory cores, FLASH memory cores, PROM cores, including EPROM and EEPROM cores, and other memory cores. Other cores available in ASIC libraries include digital signal processor cores. These come in many different varieties. Other types of core that are available in ASIC libraries are multimedia cores, which facilitate the coding or decoding of specific formats of media. Examples of multimedia cores include JPEG cores, motion JPEG cores, MPEG decoding cores, MP3 cores, and other media cores. Still other cores available in ASIC libraries are cores that provide for networking. Such cores provide for ETHERNET networking, TCP/IP networking and/or any other common networking interface protocol. As SOCs may use analog circuitry (rather than digital logic), analog cores are also readily available in ASIC libraries to perform any of the many functions for which they have an advantage over digital logic cores.

Such SOCs are "mixed-signal" SOCs, containing both analog and digital signals. Often cores themselves will be mixed-signal cores. For example, monitoring the output of an analog circuit will require an Analog-to-Digital Converter (ADC). Alternatively, using a digital signal to control an analog circuit will require a Digital-to-Analog Converter.

Any of the above-noted cores can be provided with circuits for On-Chip-Emulation to allow On-Chip-Debugging-Systems. Thus, an emulation circuit can be employed to perform testing, design validation, and debugging of programs and/or circuit functions in any of these cores. The ability to collect and control the information from the processor core 102 and the at least one other core 106 through the common emulation interface circuit 110 in accordance with the invention greatly simplifies the debugging and design validation process for the entire SOC and, by extension, an entire PCB on which the SOC may be mounted.

One skilled in the art will appreciate the above described embodiment may be extended to multiple processor cores and multiple other cores. Advantageously, the emulation interface circuit can continue to be shared by the multiple emulator circuits associated with the more than one processor core and the more than one other core.

In another embodiment, a reference clock signal is provided to emulator circuit 104 and emulator circuit 108. Preferably, emulator circuit 104 and emulator circuit 108 are operable to include timing information from the reference clock signal into the data signal from processor core 102 and the data signal from other core 106, respectively. By way of example, emulator circuit 104 may be operable to include associated timing information with program trace information, data trace information and event information within the data signals from processor core 102. Similarly, emulator circuit 108 may be operable to associate timing information with program trace information, data trace information and event information within the data signals from other core 106. The association of timing information with the respective data signals may be referred to as "time stamping," as it assigns a given time to certain pieces of data. Such time stamping by a reference clock signal synchronizes the many different pieces of data from data signals from the processor core 102 and data signals from other core 106, such that they may later be time ordered.

In a preferred embodiment, the reference clock signal is the signal provided by either the clock of the processor core 102 or the clock of the other core 106. In a more preferred embodiment, the reference clock signal is the signal of the fastest of the core clocks. In another embodiment, a reference clock on the SOC independent of the core clocks provides the reference clock signal.

In another embodiment, debug tool 130 may include a circuit operable for time ordering the respective time stamped data signals. Preferably, the debug tool 130 may include a circuit operable for time ordering the program trace information, data trace information and event information from emulator circuit 104 derived from the operation of processor core 102, and the program trace information, data trace information and event information from emulator circuit 108 to derive from the operation of other core 106.

In yet another embodiment, the host computer, such as a PC, may provide circuitry and/or software operable to time order the respective time stamped data signals. In yet another embodiment, emulation interface circuit 110 preferably includes circuits operable to time order the respective time stamped data signals. The data signals provided over emulator data channel 112 would include associated timing information, and the data signals provided over data channel 116 would include associated timing information. The software time ordering function would order the respective data signals by time and transmit such time ordered information through port 120 to debug tool 130.

Figure 2:
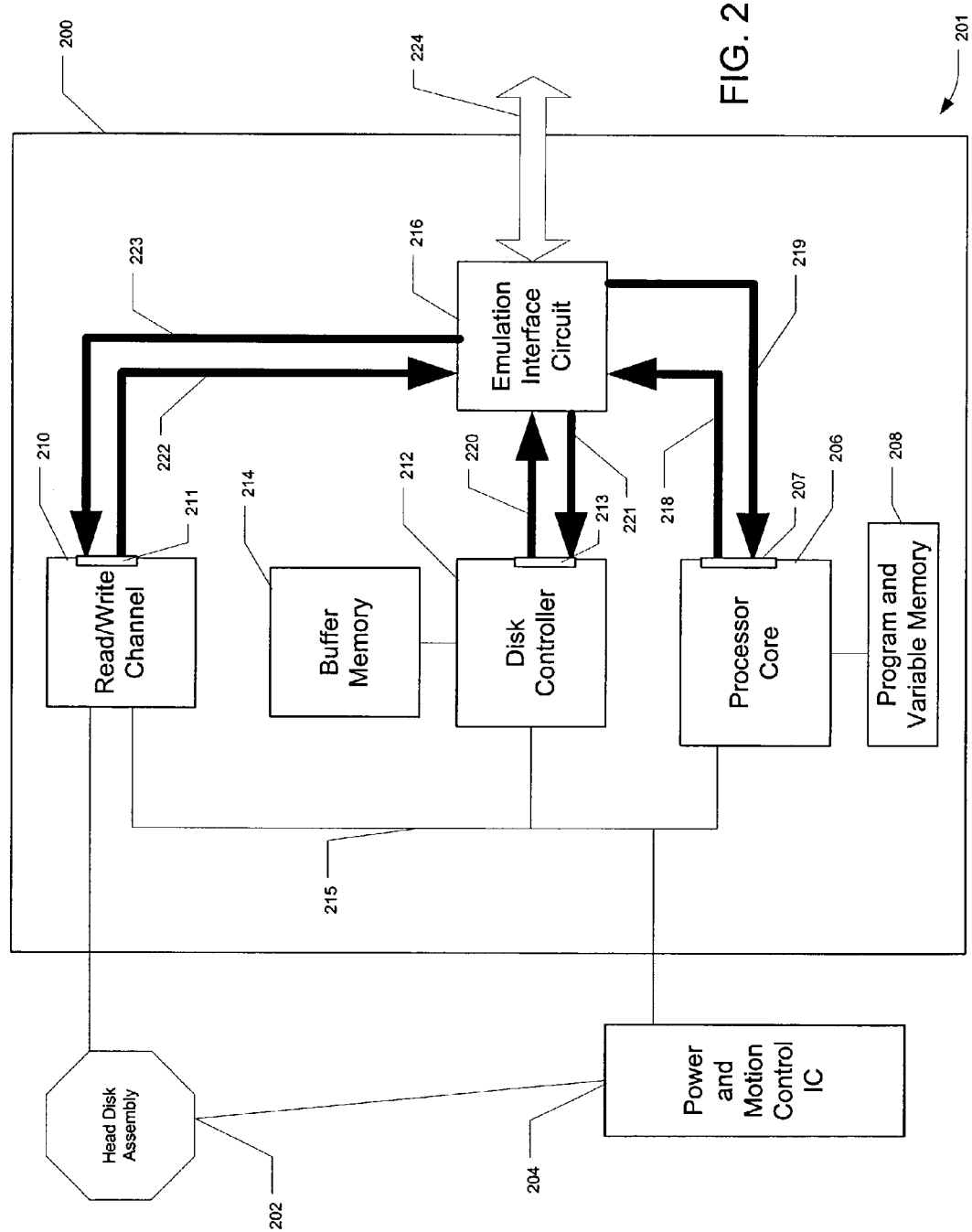
FIG. 2 is a block diagram of a more detailed alternative embodiment of an integrated circuit in accordance with one or more aspects of the present invention.

An alternative embodiment of the present invention is shown as part of a system in FIG. 2. FIG. 2 is a simplified block diagram of a hard disk system 201. This hard disk system includes head disk assembly 202 and power motion IC 204 which are operatively coupled to a hard disk controller integrated circuit (HDD IC) 200. HDD IC 200 is operable to control a hard disk. HDD IC 200 will allow read and write access to the information available to head disk assembly 202.

Preferably, HDD IC 200 includes a processor core 206, a read/write channel 210, a disk controller 212, and an emulation interface module 216. The processor core 206 provides the functions of a microprocessor. Processor core 206 is shown operatively coupled to program and variable memory 208. Preferably, program and variable memory 208 contains the program to be run on processor core 206, and the variables generated and altered by the program in processor core 206. Alternatively, processor core 206 can be considered to contain this memory as an integral part. Processor core 206 is also operatively coupled to power and motion control IC 204 through bus 215. Power and Motion control IC 204 provides processor core 206 with specialized control information. Processor core 206 includes (or is associated with) emulator circuit 207. Preferably, emulator circuit 207 is similar in operation to emulator circuit 104 previously described.

Disk controller 212 is a circuit core operable to provide control signals to control a head disk assembly such as head disk assembly 202. Preferably, disk controller 212 is operatively coupled to buffer memory 214. Preferably, buffer memory 214 provides buffer space for data flowing through disk controller 212. Disk controller 212 includes (or is associated with) emulator circuit 213. Preferably, emulator circuit 213 is similar in operation to emulator circuit 108 previously described.

Read/write channel 210 is a circuit core operable to provide input/output communications capabilities. Real/write channel 210 is shown operatively coupled to head disk assembly 202. Preferably, read/write channel 210 includes (or is associated with) emulator circuit 211. Emulator circuit 211 is preferably similar to emulator circuit 108 previously described. Preferably, processor core 206, read/write channel 210, and disk controller 212 are operatively coupled to bus 215.

One example of normal operation of such hard disk system 201 has a program executing on the processor core 206. The program is preferably stored in the memory 208. The variables created and manipulated by the program are also preferably stored in the memory 208. The program causes the processor core 206 to operate the hard disk system 201. The processor core 206 is operable to provide control signals to disk controller 212 over bus 215. These control signals, can cause, among other things, disk controller 212 to operate head disk assembly 202 to cause the reading and writing of data. There are a number of combinations of core utilization which may assist disk controller 212 in generating signals. However, a designer will often attempt to minimize any load on the processor core, which may further complicate design issues beyond the fundamental issue of a lack of any centralized controlling logic circuitry. In one embodiment, the processor core 206 may request and receive information from the power and motion control IC 204. Such information is operable to assist the processor core 206 in generating control signals to be provided to disk controller 212. Preferably, the control signals provided by disk controller 212 to operate head disk assembly 202 are transmitted through power and motion control IC 204 or read and write channel 210. Preferably, read/write channel 210 provides these control signals from disk controller 212 to head disk assembly 202. Preferably, read/write channel 210 receives data from head disk assembly 202. Read/write channel 210 transmits this data to disk controller 212 over data bus (not shown). Preferably, this data may be buffered in buffer memory 214. Preferably, this buffered data may be outputted from the integrated circuit 200 by a communications channel not shown.

The program described above enables the input and output of data from the head disk assembly 202. Such a program may have activity on processor core 206, disk controller 212 and read/write channel 210. HDD IC 200 has an emulation interface module 216 to allow for on-chip emulation. Preferably, the emulator circuit 207 provides data signals on emulator data channel 218 regarding the operation of the processor core 206. Emulator circuit 207 is preferably operable to alter the state (or condition) and operation of the processor core 206 according to control signals received over emulator control channel 219. Preferably, emulator interface circuit 216 provided the emulation control signals over emulator control channel 219 and receives the emulation data signals over emulator data channel 218.

Although the specific content of the data signals provided by emulator circuit 207 is in large part dependent on the specific type of processor core 206 employed, and in accordance with the invention, it is preferred that the data signals contain information suitable for testing, design validation, debugging, etc. For example, the data signals provided on data channel 218 are similar to the data signals provided on emulator data channel 112. Likewise, the control signals provided by emulation interface circuit 216 over emulation control channel 219 are similar to the control signals provided over emulator control channel 114.

Emulator circuit 213 preferably provides access to the circuits and their functions within disk controller 212 to facilitate testing, design, validation, debugging, etc. To that end, emulator circuit 213 preferably provides data signals on emulator data channel 220 to emulation interface circuit 216. The specific content of the data signals provided by emulator circuit 213 will depend in large part on the specific type of disk controller 212 employed. Similarly, emulator circuit 211 provides access to the circuits and functions within read/write channel 210 to facilitate testing, design, validation, debugging, etc. To that end, emulator circuit 211 provides data signals on emulator data channel 222 to the emulation interface circuit 216. Again, the specific content of the data signals provided by emulator circuit 211 will depend in large part on the specific type of read/write channel 210 employed.

For example, both disk controller 212 and read/write channel 210 will often include a mixture of analog circuitry and digital circuitry, the later being describable as a finite state machine. Thus, emulator circuit 213 and emulator circuit 211 may be able to monitor analog circuitry, for example, for threshold variables, and then pass to emulation interface circuit 216 the information. Further, emulator circuit 213 and emulator circuit 211 may be able to monitor for states and pass information regarding those states to the emulation interface circuit 216.

The testing, design, validation, debugging, etc. activities are preferably influenced by circuits outside the HDD IC 200. To that end, the emulator interface circuit 216 preferably includes a port 224 through which input/output (I/O) information passes to/from outside the integrated circuit 200. The I/O information preferably causes emulator interface circuit 216 to send the control signals to emulator circuits 207, 213 and 211. Similarly, the data signals from emulator circuits 211, 213 and 207 are preferably provided from the emulation interface circuit 216 through port 224 as part of the I/O information. Port 224 would be connected to a debug tool similar to debug tool 130.

HDD IC 200 is an example of an SOC. Formerly, the processor core 206, the read/write channel 210 and the disk controller 212 would each be independent integrated circuits on a PCB. When the various circuit cores are integrated on a single integrated circuit 200, the design validation, testing and debugging of the program running on the processor core 206 and across the rest of the circuit cores becomes much more difficult. Process activity on disk controller 212 and read/write channel 210 would likely be hidden from the programmer. Advantageously, in the present embodiment of the invention, the emulation interface module 216 may receive testing and debug data signals from emulation circuits 211 and 213 of read/write channel 210 and disk controller 212, respectively, and also configure the same emulation circuits 211 and 213. This access to information and control renders debugging a program on an SOC much easier. Further, advantageously, the port 224 is a single point of access from a debug tool to the above mentioned information and control.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An integrated circuit, comprising:
   at least one processor core;
   at least one processor emulator circuit coupled to the at least one processor core and operable to produce information indicative of process activity associated wit the at least one processor core;
   at least one other core;
   at least one other emulator circuit coupled to the at least one other core and operable to produce information indicative of process activity associated with the at least one other core;
   a single input/output port; and
   a single emulation interface circuit coupled to both the at least one processor emulator circuit and the at least one other emulator circuit and to said input/output port, said single emulation interface circuit operable to receive and compress the respective information indicative of the process activity associated with the at least one processor core and the at least one other core and to select portions of said information and transmit said selected portions through said single input/output port to one or more sources external to the integrated circuit, said single emulation interface circuit further operable to receive processor emulator control signals form said one or more sources external to said integrated circuit and transmit said control signals to said at least one processor emulator circuit and said at least one other emulator circuit.

2. The integrated circuit of claim 1, wherein:
   the at least one processor emulator circuit is further operable to produce processor emulator data signals containing the information indicative of process activity associated with the at least one processor core; and
the at least one other emulator circuit is further operable to produce other core emulator data signals containing the information indicative of process activity associated with the at least one other core.

3. The integrated circuit of claim 2, wherein the processor emulator data signals include at least one of program trace information, data trace information, event information and data associated with one or more registers in the processor core.

4. The integrated circuit of claim 3, wherein the other emulator data signals include at least one of program trace information, data Wave information, event information and data associated with one or more registers in the other core.

5. The integrated circuit of claim 2, wherein the at least one processor emulator circuit is farther operable to monitor the at least one processor core for specified process activity specified by the processor emulator control signals.

6. The integrated circuit of claim 5, wherein the specified process activity includes one or more watchpoints or breakpoints.

7. The integrated circuit of claim 5, wherein the at least one processor emulator circuit is further operable to alter the process activity of the at least one processor core in response to the processor emulator control signals.

8. The integrated circuit of claim 7, wherein altering process activity of the at least one processor core includes at least one of halting process activity, changing the values stored in one or more registers, and changing other aspects of process activity.

9. The integrated circuit of claim 7, wherein the processor emulator data signals include at least one of program trace information, data trace information, data from one or more registers in the processor core, information derived from monitoring the at least one processor core for specified process activity.

10. The integrated circuit of claim 9, wherein the information derived from monitoring the at least one processor core for specified process activity includes information about watchpoints and breakpoints.

11. The integrated circuit of claim 9, wherein the at least one other core is further operable to receive other emulator control signals.

12. The integrated circuit of claim 11, wherein the at least one emulator circuit is further operable to monitor the at least one other core for specified process activity specified by the other emulator control signals.

13. The integrated circuit of claim 12, wherein the specified process activity includes one or more watchpoints or breakpoints.

14. The integrated circuit of claim 12, wherein the at least one other emulator circuit is further operable to alter the process activity of the at least one other core.

15. The integrated circuit of claim 14, wherein altering process activity includes at least halting process activity, changing the values stored in one or more registers, and changing other aspects of process activity.

16. The integrated circuit of claim 14, wherein the other emulator data signals include at least one of program trace information, data trace information, data associated with one or more registers in the other core, information derived from monitoring the at least one other core for specified process activity.

17. The integrated circuit of claim 16, wherein the information derived from monitoring the at least one other core for specified process activity includes information about watchpoints and breakpoints.

18. The integrated circuit of claim 4, further comprising a reference clock signal;
wherein the processor emulator data signals include timing information from the reference clock signal, and the other emulator data signals include timing information from the reference clack signal.

19. The integrated circuit of claim 18, wherein the timing information included in the processor emulator data signals and the timing information included in the other emulator data signals allow the data signals to be ordered in time.

20. The integrated circuit of claim 19, wherein the timing information included in the processor emulator data signals and the timing information included in the other emulator data. signals allows the ordering in time of the program trace information of the processor emulator data signals and the program trace information of the other emulator data signals.

21. The integrated circuit of claim 19, wherein the timing information included in the processor emulator data signals and the timing information included in the other emulator data signals allows ordering in lime of the data trace information of the processor emulator data signals and the data trace information of the other emulator data signals.

22. The integrated circuit of claim 19, wherein the timing information included in the processor emulator data signals and the timing information included in the other emulator data signals allows ordering in time of the event information of the processor emulator data signals and the event information of the other emulator data signals.

23. The integrated circuit of claim 17, further comprising a clock signal generator operable to provide a reference clock signal.

24. The integrated circuit of claim 17, wherein a local clock of any of the cores provides the reference clock signal.

25. The integrated circuit of claim 1, wherein the at least one other core is selected from the group consisting of a processor core, a memory core, a RAM memory core, a ROM memory core, a FLASH memory core, a PROM core, an EPROM memory core, an EPPROM memory core, a memory controller core, a direct memory access controller core, a digital signal processor core, a multimedia processing core, a JPEG decoding core, a MPEG decoding core, a networking core, an ETHERNET networking core, a TCP/IP networking core, an analog circuit core, a device-specific controller core, a disk controller core, a general finite state machine core and a communications core.

26. The integrated circuit of claim 1 wherein said at least one other core comprises a non-processor enhanced circuit core and wherein said at least one other emulator circuit is operable to produce non-processor core data signals containing information indicative of process activity associated with the non-processor core.

27. The enhanced circuit core of claim 26, wherein the at least one other emulator circuit is further operable to monitor the non-processor core for specified process activity in response to control signals from said at least one other emulator circuit.

28. The enhanced circuit core of claim 27, wherein the at least one other emulator circuit is further operable to alter activity monitored in the non-processor core in response to control signals from said at least one other emulator circuit.

29. The enhanced circuit core of claim 28, wherein the non-processor care control signals are transmitted from said emulation interface circuit.

30. The enhanced circuit core of claim 29, wherein processor core data signals are transmitted to the emulation interface circuit from a processor core.

31. A system for debugging integrated circuits, comprising:
- an input/output port;
- a debug tool coupled to said input/output port;
- an integrated circuit including at least one processor core;
- at least one processor emulator circuit coupled to the at least one processor core and operable to produce information indicative of operative activity associated with the at least one processor core;
- at least one other core;
- at least one other emulator circuit coupled to the at least one other core and operable to produce information indicative of operative activity associated with the at least one other core; and
- a single emulation interface circuit coupled to both the at least one processor emulator circuit, and the at least one other emulator circuit, and to said input/output port, said emulation interface circuit operable to receive and compress the respective information indicative of the operative activity associated with the at least one processor core and the at least one other core, and output selected portions of the respective information through said input/output port to the debug tool, said single emulation interface circuit further operable to receive processor emulator control signals from said debug tool and transmit said control signals to said at least one processor emulator circuit and said at least one other emulator circuit.

32. The system of claim 31, wherein the at least one processor emulator circuit is further operable to produce processor emulator data signals containing the information indicative of operative activity associated with the at least one processor core;
the at least one other emulator circuit is further operable to produce other core emulator data signals containing the information indicative of operative activity associated with the at least one other core.

33. The system of claim 32, wherein the processor emulator data signals include at least one of program trace information, data trace information, event information, and data associated with one or more registers in the processor core; and the other emulator data signals include at least one of program trace information, data trace information, event information, and data associated with one or more registers in the other core.

34. The system of claim 33, wherein the at least one processor emulator circuit is further operable to monitor the at least one processor core for specified process activity specified by the processor emulator control signals; and the at least one other emulator circuit is further operable to monitor the at least one other core for specified process activity specified by the other emulator control signals.

35. The system of claim 34, wherein the specified process activity includes at least one or more watchpoints or breakpoints.

36. The system of claim 34, wherein the at least one processor emulator circuit is further operable to alter the process activity of the at least one processor core in response to processor emulator control signals; and the at least one other emulator circuit is further operable to alter the process activity of the at least one other core in response to other emulator control signals.

37. The system of claim 42, wherein altered process activity of the at least one processor core includes at least one of halting process activity, changing the data within one or more registers, and changing other aspects of process activity; and the altered process activity of the at least one other core includes at least one of halting process activity, changing the data within one or more registers, and changing other aspects of process activity.

38. The system of claim 37, wherein the processor emulator data signals include at least one of program trace information, data trace information, data associated with one or more registers in the processor core and other information derived from monitoring the at least one processor core for specified process activity; and the other emulator data signals include at least one of program trace information, data trace information, data associated with one or more registers in the other core, and other information derived from monitoring the at least one other core for specified process activity.

39. The system of claim 38, wherein the specified process activity of the at least one processor core includes one or more watchpoints or breakpoints; and the specified process activity of the at least one other core includes one or more watchpoints or breakpoints.

40. The system of claim 34, further comprising a reference clock signal; wherein the processor emulator data signals include timing information from the reference clock signal, and wherein the other emulator data signals include timing information from the reference clock signal.

41. The system of claim 40, wherein the debug tool includes software for time ordering debug information.

42. The system of claim 31 wherein said debug tool comprises a receiving circuit operable to receive emulation interface circuit data signals including information indicative of process activity in at least one processor core and information indicative of process activity in at least one other core;
- a translation circuit operable to change the emulation interface circuit data signals into host readable data signals; and
- a transmitting circuit operable to transmit the host readable data signals.

43. The debug tool of claim 42, further comprising software for time ordering debug information.

44. A method of debugging a program operating on an integrated circuit comprising:
- detecting information indicative of process activity in a processor core wit a processor emulator circuit;
- detecting information indicative of process activity in an other core with an other emulator circuit;
- providing the information indicative of process activity in the processor core to a single emulation interface circuit;
- providing the information indicative of process activity in an other core to said single emulation interface circuit; and
- wherein said emulation interface circuit comprises selecting portions of said information and then compressing and transmitting information through an input/output port to circuitry outside of said integrated circuit.

45. The method of claim 44, wherein providing the information indicative of process activity in a processor core includes providing at least one of program trace information, data trace information and data associated with one or more registers; and
providing the information indicative of process activity in another core includes providing at least one of program trace information, data trace information and data associated with one or more registers.

46. The method of claim 44, further comprising providing processor emulator control signals to the processor emulator circuit;
    monitoring the processor core for process activity specified by the processor emulator control signals;
    providing other emulator control signals to the other emulator circuit;
    monitoring the other core for process activity specified by the other emulator control signals; and
    providing information about specified process activity to the processor core or the other core to the emulation interface circuit.

47. The method of claim 46, wherein monitoring the processor core for specified process activity includes monitoring the processor core for one or more breakpoints and watchpoint; and monitoring the other core for specified process activity includes monitoring the other core for one or more breakpoints and watchpoints.

48. The method of claim 46, further comprising:
    altering the process activity of the processor core in response to the processor emulator control signals; and
    altering the process activity of the other core in response to other emulator control signals.

49. The method of claim 48, wherein altering the process activity of the processor core includes halting process activity, changing the values stored in one or more registers, and changing the other aspects of process activity, and altering the process activity of the other core includes halting process activity, changing the values stored in one or more registers, and changing other aspects of process activity.

50. The method of claim 48, further comprising adding timing information to the processor emulator data signals and the other emulator data signals.

51. The method of claim 50, further comprising synchronizing processor emulator data signals and other emulator data signals.

52. The method of claim 51, wherein the synchronizing occurs off the integrated circuit.

53. The method of claim 52, wherein the synchronizing occurs on the emulator interface circuit.

* * * * *

UNITED STATES PATENT AND TRADEMARK OFFICE
CERTIFICATE OF CORRECTION

PATENT NO.        : 7,058,855 B2
APPLICATION NO. : 10/202372
DATED             : June 6, 2006
INVENTOR(S)       : Rohfleisch et al.

It is certified that error appears in the above-identified patent and that said Letters Patent is hereby corrected as shown below:

Column 13, line 14;  delete "data Wave information" insert --data trace information--
Column 14, line 10;  delete "clack signal" insert --clock signal--
Column 14, line 18;  delete "data. signals" insert --data signals--
Column 14, line 24;  delete "in lime" insert --in time--

Signed and Sealed this

Twenty-ninth Day of May, 2007

JON W. DUDAS
*Director of the United States Patent and Trademark Office*